Figure 1:
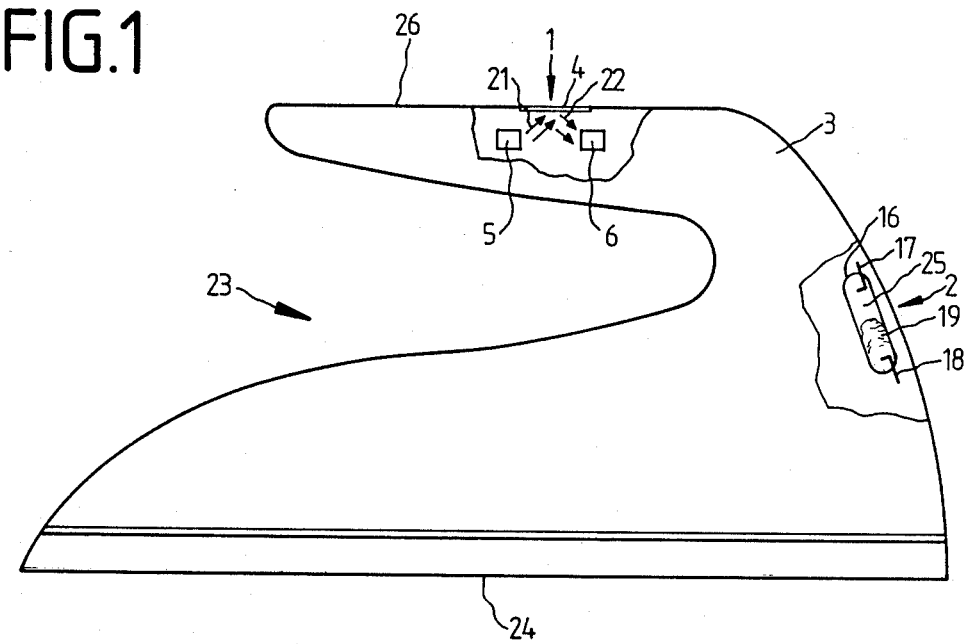

United States Patent [19]

Heuwinkel et al.

[11] Patent Number: 4,859,869
[45] Date of Patent: Aug. 22, 1989

[54] SAFETY SWITCHING MEANS FOR CONTROLLING A CURRENT CONSUMER

[75] Inventors: Lothar Heuwinkel, Eppstein; Herbert Hofinger, Oberursel, both of Fed. Rep. of Germany

[73] Assignee: Braun Aktiengesellschaft, Kronberg, Fed. Rep. of Germany

[21] Appl. No.: 190,106

[22] Filed: May 4, 1988

[30] Foreign Application Priority Data

May 9, 1987 [DE] Fed. Rep. of Germany ....... 3715497

[51] Int. Cl.⁴ .................. H01H 36/00; H05B 1/02; D06F 75/26
[52] U.S. Cl. .................... 307/117; 307/116; 219/251; 219/254
[58] Field of Search .............. 307/112, 116, 117; 361/173, 174, 175, 176, 177, 179, 180, 181; 219/250, 257, 259, 262, 263, 247, 507, 509, 518, 497, 245–259, 339, 333, 327, 328, 379, 412, 414, 425, 435; 340/555, 556, 557; 38/81, 82, 93, 97

[56] References Cited

U.S. PATENT DOCUMENTS

| 2,382,587 | 8/1945 | Thomas . | |
|---|---|---|---|
| 3,086,146 | 4/1963 | Edler | 361/177 X |
| 3,560,714 | 2/1971 | McDonald . | |
| 3,906,187 | 9/1975 | Turoczi, Jr. | 219/254 |
| 3,931,514 | 1/1976 | Patterson | 307/117 X |
| 4,031,560 | 6/1977 | Maresh | 307/117 X |
| 4,305,006 | 12/1981 | Walthall et al. | 307/38 |
| 4,334,145 | 6/1982 | Norris . | |
| 4,347,428 | 8/1982 | Conrad et al. | 219/251 |
| 4,520,257 | 5/1985 | Schwob . | |
| 4,686,352 | 8/1987 | Nawrot et al. | 219/251 X |
| 4,751,399 | 6/1988 | Koehring et al. | 307/116 X |

FOREIGN PATENT DOCUMENTS

| 238331 | 2/1965 | Austria . |
|---|---|---|
| 7132382 | 4/1972 | Fed. Rep. of Germany . |
| 1515042 | 7/1972 | Fed. Rep. of Germany . |
| 2526732 | 4/1976 | Fed. Rep. of Germany . |
| 2517597 | 11/1976 | Fed. Rep. of Germany . |
| 2831858 | 2/1980 | Fed. Rep. of Germany . |
| 2844089 | 4/1980 | Fed. Rep. of Germany . |
| 3117205 | 12/1982 | Fed. Rep. of Germany . |
| 2627158 | 6/1983 | Fed. Rep. of Germany . |
| 3146152 | 6/1983 | Fed. Rep. of Germany . |
| 3512906 | 1/1986 | Fed. Rep. of Germany . |
| 3444348 | 6/1986 | Fed. Rep. of Germany . |
| 3702361 | 7/1987 | Fed. Rep. of Germany . |
| 225026 | 7/1985 | German Democratic Rep. . |
| 228945 | 10/1985 | German Democratic Rep. . |
| WO/82/035-20 | 10/1982 | PCT Int'l Appl. . |
| 2163574 | 2/1986 | United Kingdom . |

OTHER PUBLICATIONS

"Elektrowarme im Technischen Ausbau" (elektrowarme international Edition A), 43 (1985) A3, May, p. A 75.

Primary Examiner—William M. Shoop, Jr.
Assistant Examiner—Paul Ip

[57] ABSTRACT

The safety switching means comprises a source of radiation (21) which is switched on and off periodically. Only in the event that radiation (22) was detected by the detector (6) when the source of radiation (21) is switched on, it will be checked—with the source of radiation (5) switched off—whether the detector (6) is applied by radiation (22) nonetheless, and, in the event of no radiation being found by the detector (6), the current consumer will be switched on automatically by the switching means, since it is certain that the hand of a user covers the window (4).

11 Claims, 2 Drawing Sheets

SAFETY SWITCHING MEANS FOR CONTROLLING A CURRENT CONSUMER

The present invention relates to a safety switching means for controlling a current consumer of a hand-operated electrical appliance, in particular an iron.

A like switching means for an iron is known for instance from German published patent application No. 28 44 089. In this safety switching means, a key switch is disposed in the handle which can be switched on and off by means of a spring-loaded operating lever placed at the bottom side of the handle, with a view to controlling a heater device designed in the iron's soleplate. Said operating lever projects downwardly from the outer surface of the handle's bottom side. When the iron's handle is gripped, the operating lever is pressed by the user's hand into the handle in opposition to a spring force, the key switch being actuated in consequence thereof. This releases the current supply to the heater device. For detecting that the iron is placed in the upright or horizontal state of position, the illustrated embodiment provides for a position-responsive sensing means which is realised in the type of a mercury switch arranged in the handle vertically to the iron's soleplate. When the iron is in a horizontal working position, the current supply is interrupted by this position-responsive switch only if the key switch is not actuated. When the iron is placed in its upright position, the filament circuit is released irrespective of the actuation of the operating lever by virtue of the mercury switch.

A similar embodiment of a safety switching means is shown in U.S. Pat. No. 2,382,587, wherein the lower half of the handle is designed as a rocker switch which, when the handle is gripped, serves to likewise actuate a key switch for switching on and/or off the heater current. The positionmonitoring is also performed by means of a mercury switch. The iron disclosed in this patent specification is additionally furnished with a clockwork adapted to be wound up by the oscillating iron movement, which clockwork permits afterheating of the iron even in its horizontal position after the handle is released for still a pre-adjustable time interval.

These embodiments of safety switching means designed in irons require from the user to apply additional finger pressure what is regarded as disadvantageous because of the occurrence of fatigue and what impairs the operating comfort the iron affords. Moreover, such switches and operating levers are susceptible to defects due to the occurrence of contaminations and a great switching frequency, what results in the iron's malfunction. On the other hand, such safety switching means inhere a safety risk because, if the switch inadvertently remains in its on-position on account of a defect, the current will not be cut off in the iron's horizontal position—on what the user possibly relies.

Admittedly, a non-contact safety switching means is known from German patent specification No. 26 27 158 which is equipped with a position-responsive and acceleration-sensitive mercury switch. On the one hand, this mercury switch activates the filament circuit of the iron and/or remains switched on only if constantly oscillating movements act upon the iron in the iron's horizontal position, or if the iron is in its vertical position, on the other hand. Although this safety switching means operates absolutely maintenance-free and reliably, a shortcoming resides in that even in the event of the iron's base being slightly inclined in the iron's rest position, safe switching-off will not be guaranteed any more in every case, since due to the ease of movability of the ball, a slightly inclined position will cause displacement of the ball and thereby renders possible an undesired switching-on of the switch by the ball.

It is, therefore, an object of the present invention to devise a safety switching means for an iron which permits to increase the iron's operating comfort, which obviates the need for mechanical switching means, which releases the filament circuit in the iron's vertical position and which, in the iron's horizontal position, permits switching-on of the heating only in the event of the user operating the iron.

This object is achieved according to this invention in that the safety switching means is composed of a source of radiation, a detector placed outside of the cone of radiation of the source of radiation as well as an outlet opening for the radiation, with the detector being fitted such that, when the source of radiation is covered by the user's hand, portions of the radiation are directed by reflection to the detector, and in that the safety switching means comprises an evaluating circuitry which, in the event of radiation striking the detector, finds out whether this radiation is outside light which entered through the outlet opening, or whether it is a radiation of the source of radiation reflected by the hand, and which circuitry will control the current consumer only if a reflected radiation is concerned. It is ensured owing to this inventive arrangement that the light emitted from the source of radiation will strike the radiation detector by reflection only if the iron's handle is touched by the user in a proper-to-use fashion. When the radiation of the source of radiation strikes the detector due to this reflection, an auxiliary circuit will cause actuation of a switch which is disposed in the filament circuit of the iron and which allows to release the heater current to the heating.

In order to safeguard that the heater current will not be switched on and/or remain switched on already by way of outside light when the safety switching means is designed as stated hereinabove, it is arranged for in an improvement of the instant invention that the source of radiation will switch on and off periodically, that only in the event of radiation being detected at the detector when the source of radiation is switched on, it will be checked when the source of radiation is switched off, whether the detector is applied by radiation nevertheless, and that only in the event of absence of radiation at the detector the current consumer will be connected to the current source. This way, it is always safeguarded that the current consumer will be switched on only if the user is actually operating the iron that is disposed in its horizontal working position and/or has put his/her hand on the iron's handle.

A particularly low-cost sensor device which lends itself to being easily integrated into the iron is favourably accomplished in that the source of radiation consists of a photodiode, and the detector consists of a phototransistor. To the end that the sensor device is actually covered by the user's hand during the ironing action, the outlet opening is contained on the upper side of the handle. It is ensured by this measure that it is always the large-area hand portion—and not the individual fingers—that reliably covers the outlet opening.

A particularly low-cost and reliably operating evaluating circuitry can be realised by means of a microcomputer integrated in the iron, the said microcomputer simultaneously performing the control of the current consumer. In order to maintain the iron in a ready-to-use heated condition when it is placed in its upright position, like in known switching means, there is provision of a position-responsive sensing device, preferably in the form of a mercury switch, which bridges the safety switching means for the horizontal operation of the iron. When the iron is in a horizontal working position, the heater current is influenced only by the sensing device arranged in the handle when said handle is touched by the user.

A safety switching means according to this invention permits to be realised in a particularly simple manner in irons which are equipped already with a microcomputer, such as e.g. a single-chip computer, for the control of other functions, for instance for controlling the time-responsive control of the heater current by merely one position sensor. In these irons, it is solely required to program in the microcomputer the additional functions for the evaluation of the sequence of the potentials on source of radiation and detector.

Figure 2:
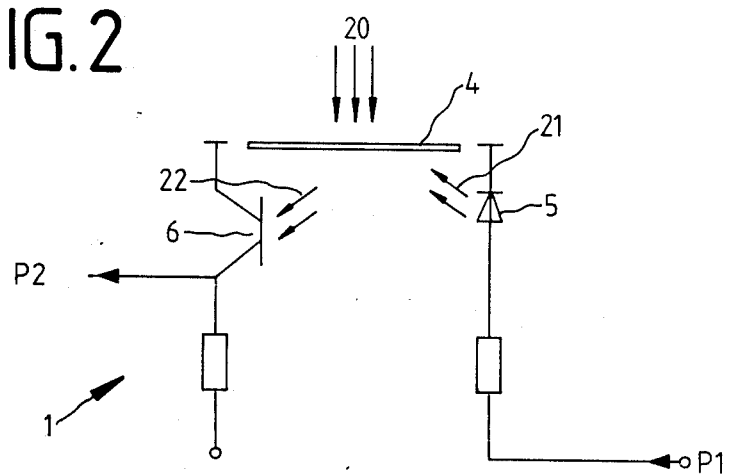
Figure 3:
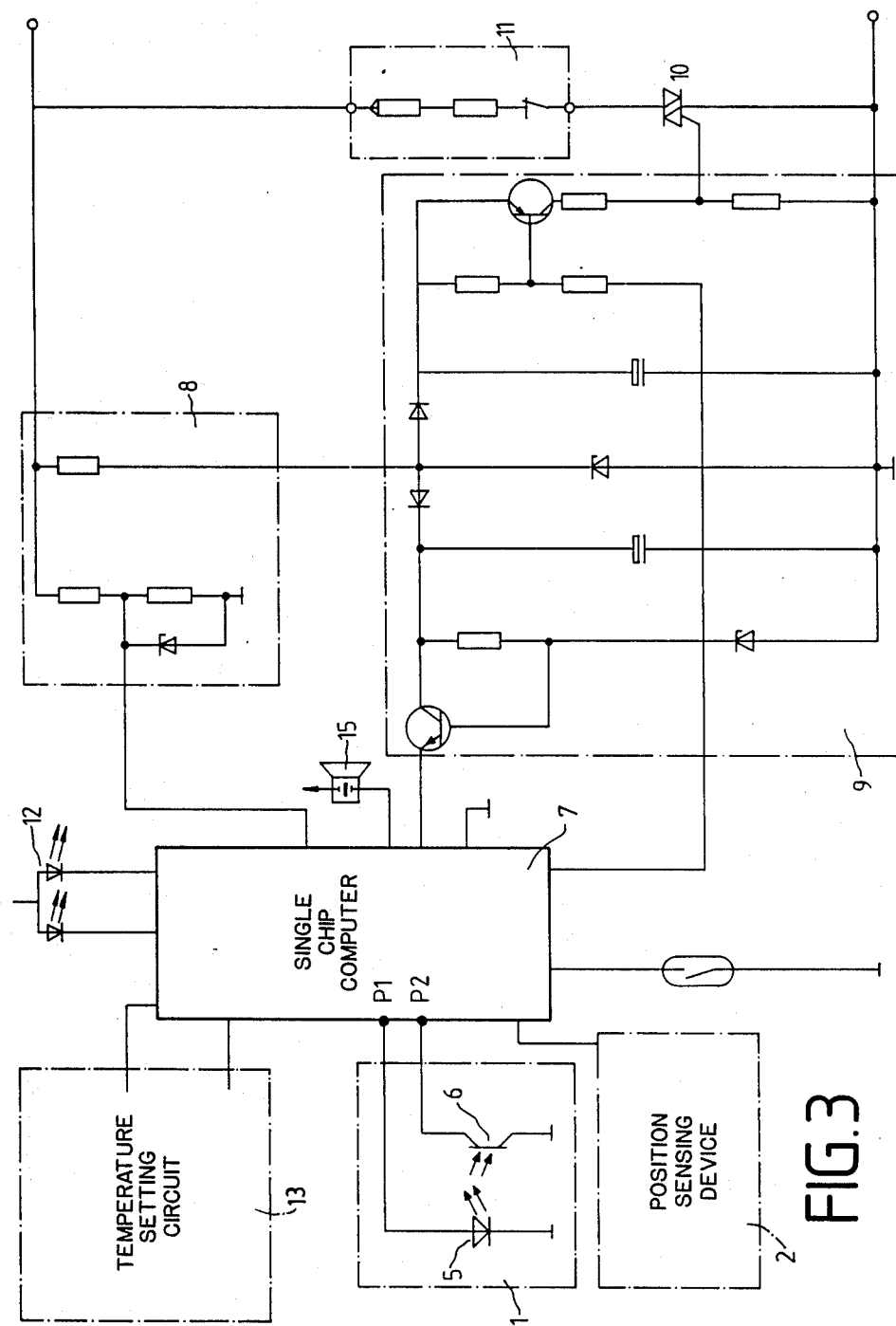

One embodiment of the present invention will be explained in more detail hereinbelow with reference to the accompanying drawings. In the drawings, FIG. 1 is a side view of a schematically illustrated iron with partial cross-sectional views of the first and second sensing device;

FIG. 2 is a schematically illustrated reflection light barrier according to this invention, and FIG. 3 is a schematically illustrated circuit diagram of the inventive safety switching means with a reflection light barrier according to FIG. 2 connected to a microcomputer.

FIG. 1 displays the side view of an iron 23 having a fist sensing device 1 designed in a partial section of the handle 3 and serving to detect whether the handle 3 is gripped by a hand or not. A second sensing device 2 which serves to detect the state of position of the iron 23 is disposed at the transition from the handle 3 to the base portion of iron 23 in said's rear part, shown in another partial cross-section.

This second sensing device 2 is composed of a mercury switch 25 arranged substantially vertically to the iron's soleplate 24 and comprising a closed glass tube 16 into whose upper and lower end each one contact lug 17, 18 is extending, as shown in the drawing. The ends of the contact lugs 17, 18 placed in the glass tube 16 are so far apart from each other that in the ironing position, that is in the horizontal position of the iron 23, the mercury bead 19 disposed in the glass tube 16 will not interconnect the two contact lugs 17, 18, whilst it interconnects both contact lugs 17, 18 and allows current flow in the upright and/or vertical position of the iron, that is in its rest position.

According to FIGS. 1 and 2, the first sensing device 1 is arranged in the handle 3 at said's upper side 26 behind a window 4 and is composed of a light-emitting diode 5 and a phototransistor 6. This light-emitting diode 5 is arranged such that its deflected light 21 will exit at an angle of incidence transversely upwardly through the light-transmitting window without influencing the phototransistor 6. When the iron 23 is used, the user's hand will cover the lighttransmitting window 4 and reflect the beam of radiation 21 onto the phototransistor 6 via the beam of radiation 22 which, by virtue of an auxiliary circuit, actuates a switch interposed in the filament circuit 11 (FIG. 3) of the iron 23 and connects the heater current to the heater spirals.

In the embodiment shown in FIG. 1, the window 4 is located on the upper side of the handle 3; yet any other positioning of the window 4 on the handle 3 is possible as well, provided that the window 4 can be covered by a user's hand at that location, too.

FIG. 2 shows schematically the design and the arrangement of the switching elements for the first sensing device 1 with the light-emitting diode 5, the light-transmitting window 4 and the phototransistor 6. The arrows 20 showing to the window 4 from above represent schematically the light striking the window 4 from the outside, when the window 4 is not hidden by the hand of an ironing person. The input signal P1 switches on the light-emitting diode 5 which emits a beam of light 21 transversely to the window 4, as viewed in the drawing. The phototransistor 6 issues the output signal P2 in response to the light leak 22 onto the phototransistor 6.

FIG. 3 displays by way of a block wiring diagram how a reflection light barrier 1 according to this invention having a source of radiation 5 and a detector 6 can be integrated into an iron 23 furnished with a single-chip computer 7. In parallel to the filament circuit 11, said single-chip computer 7 is supplied with its voltage via a control element 8 and, in turn, issues ignition pulses via an ignition pulse generator 9 to a bidirectional triode thyristor 10 arranged in the filament circuit 11. In this arrangement, the bidirectional triode thyristor 10 serves to control the flow of current to the heater spiral of the calculated temperature or the temperature derived from the monitoring circuitry and/or the current supply required therefor. On its input side, the single-chip computer 7 is controlled by a temperature-measuring circuit 12, by a temperature-setting circuit 13, by the first sensing device 1 as well as by the second position-sensing device 2. A second or sight signalling device for the display of a defined operating condition of the iron 23 is globally referred to by reference numeral 13.

It is a matter of act to those acquainted with the art to program the single-chip computer 7 in a manner such as to allow to conduct the program predefined by this invention. The detector 6 can likewise be designed such that it is able to make a distinction between whether it is actually a hand or a cloth which covers the window 4.

It is self-explanatory that the instant invention described by way of the above embodiment lends itself to modification in many points. Thus, it is e.g. also possible to use an electro-optical means for the purpose of detecting the position of the iron 23, that is to say, whether it is in its working position or in its upright position, the said means being a sensing device identical in construction with that one of the invention and arranged on the backside of the iron on which it is placed in its upright position, this being permitted because the reflection can be effected by the ironing table in the iron's upright position.

The mode of effect of the inventive iron is as follows:

If the diode 5 does not emit any light and the phototransistor 6 does not either receive any light in the horizontal position of the iron 23, there is absence of intrinsic light and outside light, that means the heating remains switched off. If the diode 5 emits light and the phototransistor does not receive any light, there is absence of outside light and of reflection. In this event, too, the heating remains switched off. If the diode 5 does not emit light and if the phototransistor 6 receives light, outside light is present, that means the heating stays switched off. If the diode 5 emits light and if the phototransistor 6 receives light, either reflection or outside light is prevailing. The diode 5 will then be disconnected for a check in a fraction of a second. If now the phototransistor 6 receives light, it is certain that outside light is present. However, if the phototransistor 6 does not receive any light in this condition, it is certain that a user has put his/her hand on the handle 3. Only now will the filament circuit 11 to the heater device be released. Thus, it will be found out in the fraction of a second, whether or not the iron 23 is operated by a user by constantly switching on and off the diode 5 and by simultaneously interrogating the condition of the phototransistor 6.

We claim:

1. A hand-operated electrical appliance, in particular an iron, comprising a body portion that includes a handle portion, an electrical load in said body portion, an outlet opening in said handle portion,
   safety switching means in said appliance, said safety switching means including a radiation source disposed in said handle portion for directing a beam of radiation along a predetermined path towards and through said outlet opening,
   a radiation detector disposed in said handle portion adjacent said outlet opening such that said radiation detector is not exposed to radiation from said source along said predetermined path, said radiation detector being located such that when said outlet opening is covered by the hand of a user of said appliance, radiation from said predetermined path is reflected by the hand to said detector, and
   evaluation circuitry responsive to radiation striking said detector for determining whether that radiation is outside light which entered through said outlet opening or whether that radiation is radiation from said radiation source and reflected by the hand of the user, said evaluation circuitry being adapted to cause electrical energy to be applied to said electric load only while said detector senses radiation from said radiation source that is reflected by the hand of the user.

2. An appliance is claimed in claim 1 wherein said evaluation circuitry includes means for switching said radiation source off and on periodically such that in the event that said detector senses radiation when said radiation source is switched on, said radiation source will be switched off during a subsequent interval and electrical energy will be applied to said electrical load only in the event that no radiation is sensed by said detector during said subsequent interval.

3. An appliance is claimed in claim 1 wherein said source of radiation includes a photodiode and said detector includes a phototransistor.

4. An appliance is claimed in claim 1 wherein said outlet opening is on the upper side of said handle.

5. An appliance claimed in claim 1 wherein said evaluating circuitry includes a microcomputer which also controls the application of electrical energy to said electrical load.

6. An appliance as claimed in claim 1 wherein said appliance is an electric iron that has a sole plate on one side of said body and said handle portion is on the side of said body portion opposite of said sole plate, said outlet opening is arranged on the side of said handle portion opposite said sole plate, and said electrical load includes a heater for applying thermal energy to said sole plate.

7. An electric iron as claimed in claim 6 and further including a second sensing device in said body portion for detecting the state of position of said iron, and means connecting said second sensing device to said evaluation circuitry for controlling application of electrical energy to said electrical load.

8. An electric iron as claimed in claim 7 wherein said second sensing device includes a mercury switch.

9. An electric iron as claimed in claim 6 wherein said evaluation circuitry includes means for switching said radiation source off and on periodically such that in the event that said detector senses radiation when said radiation source is switched on, said radiation source will be switched off during a subsequent interval and electrical energy will be applied to said electrical load only in the event that no radiation is sensed by said detector during said subsequent interval.

10. An electric iron claimed in claim 9 wherein said evaluating circuitry includes a microcomputer which also controls the application of electrical energy to said electrical load.

11. An electric iron is claimed in claim 10 wherein said source of radiation includes a photodiode and said detector includes a phototransistor.

* * * * *

UNITED STATES PATENT AND TRADEMARK OFFICE
CERTIFICATE OF CORRECTION

PATENT NO. : 4,859,869

DATED : August 22, 1989

INVENTOR(S) : Lothar Heuwinkel, et al.

It is certified that error appears in the above-identified patent and that said Letters Patent is hereby corrected as shown below:

Col. 1, line 37, "positionmonitoring" should be --position-monitoring--.
Col. 3, line 34, change "fist" to --first--.
Col. 3, line 63, "ligthtransmitting" should be --light-transmitting--.
Col. 4, line 18, "tor6" should be --tor 6--.
Col. 4, line 30, after "the" (first occurrence) insert --filament circuit 11 in such a fashion as to achieve the--.
Col. 4, line 36, "second" should be --sound--.
Col. 4, line 38, "13" should be --15--.
Col. 4, line 39, "act" should be --fact--.

Signed and Sealed this

Fourth Day of December, 1990

Attest:

HARRY F. MANBECK, JR.

Attesting Officer

Commissioner of Patents and Trademarks